(12) United States Patent
Chang et al.

(10) Patent No.: US 9,647,020 B2
(45) Date of Patent: May 9, 2017

(54) LIGHT SENSING CIRCUIT AND CONTROL METHOD THEREOF

(71) Applicant: NATIONAL SUN YAT-SEN UNIVERSITY, Kaohsiung (TW)

(72) Inventors: Ting-Chang Chang, Kaohsiung (TW); Hua-Mao Chen, Kaohsiung (TW); Ming-Yen Tsai, Kaohsiung (TW); Min-Chen Chen, Kaohsiung (TW)

(73) Assignee: NATIONAL SUN YAT-SEN UNIVERSITY, Kaohsiung (TW)

( * ) Notice: Subject to any disclaimer, the term of this patent is extended or adjusted under 35 U.S.C. 154(b) by 87 days.

(21) Appl. No.: 14/800,481

(22) Filed: Jul. 15, 2015

(65) Prior Publication Data

US 2016/0358956 A1 Dec. 8, 2016

(30) Foreign Application Priority Data

Jun. 2, 2015 (TW) .............................. 104117788 A

(51) Int. Cl.
*H01L 27/146* (2006.01)
*H01L 31/101* (2006.01)

(52) U.S. Cl.
CPC ...... *H01L 27/14612* (2013.01); *H01L 31/101* (2013.01)

(58) Field of Classification Search
CPC ......... H01L 27/14612; H01L 27/14614; H01L 27/14616; H01L 27/14609; H01L 27/146; H01L 27/14601; H01L 31/101; H01L 31/10; H01L 31/09; H01L 31/08; H01L 31/11; H01L 31/1105; H01L 31/112; H01L 31/1121; H01L 31/1122; H01L 31/1123; H01L 31/1124; H01L 31/1125; H01L 31/1126; H01L 31/1127; H01L 31/1128; H01L 31/1129
See application file for complete search history.

(56) References Cited

U.S. PATENT DOCUMENTS

| | | | | |
|---|---|---|---|---|
| 3,721,839 A | * | 3/1973 | Shannon | H01L 31/1126 257/258 |
| 4,907,054 A | * | 3/1990 | Berger | H01L 27/14665 257/443 |
| 6,787,808 B1 | * | 9/2004 | Zhang | H01L 31/1129 257/291 |

(Continued)

*Primary Examiner* — John Lee
(74) *Attorney, Agent, or Firm* — Muncy, Geissler, Olds & Lowe, P.C.

(57) ABSTRACT

A light sensing circuit for solving the problem of low reliability in illumination detection includes a photo transistor having a gate, a drain and a source; a first transistor electrically connecting between the gate and source of the photo transistor; a first capacitor electrically connecting between the gate and the drain of the photo transistor; a second transistor electrically connecting with the drain of the photo transistor, the first capacitor, and a data signal; a second capacitor electrically connecting between the source of the photo transistor and a ground contact; a third transistor electrically connecting with the photo transistor, the first transistor, and the second capacitor; and a switch adapted to alternatively connect the third transistor with a buffer or a zero signal. A control method of the above light sensing circuit is also disclosed. Therefore, the above identified problem can be surely solved.

6 Claims, 9 Drawing Sheets

(56) References Cited

U.S. PATENT DOCUMENTS

| | | | | |
|---|---|---|---|---|
| 7,176,495 B2* | 2/2007 | Zhang | ............... | H01L 31/1129 257/291 |
| 2005/0029524 A1* | 2/2005 | Zhang | ............... | H01L 31/1129 257/72 |
| 2008/0099797 A1* | 5/2008 | Kerns | ............... | H01L 31/1126 257/258 |
| 2015/0034833 A1* | 2/2015 | Blanchon | ............... | H04N 5/232 250/370.11 |
| 2015/0048241 A1* | 2/2015 | Nathan | ............... | G01D 5/24 250/214 A |
| 2016/0315111 A1* | 10/2016 | Park | ............... | H01L 27/14612 |
| 2016/0358956 A1* | 12/2016 | Chang | ............... | H01L 31/101 |

\* cited by examiner

LIGHT SENSING CIRCUIT AND CONTROL METHOD THEREOF

BACKGROUND OF THE INVENTION

1. Field of the Invention

The present invention generally relates to an light sensing circuit and control method thereof. More particularly, the present invention relates to a light sensing circuit capable of voltage compensation and the control method thereof.

2. Description of the Related Art

Referring to FIG. 1, the circuit diagram of a conventional light sensing circuit 9 is shown. The light sensing circuit 9 includes a photo transistor 91 and a control transistor 92, and these two transistors 91, 92 can be thin-film transistors (TFTs). The gate and source of the photo transistor 91 electrically connect to a light sensing scan signal "$V_{s1}$," the bulk of the photo transistor 91 electrically connects to a bias voltage "$V_b$," and the drain of the photo transistor 91 electrically connects to a capacitor 93. The source of the control transistor 92 also electrically connects to the capacitor 93, the gate of the control transistor 92 electrically connects to a control scan signal "$V_{s2}$," and the drain of the control transistor 92 alternatively connects to a zero signal "$V_m$," such as a zero volt signal, or a output buffer 95 via a switch 94. The buffer can be adapted to output a light sensing signal "$V_o$" so as to be widely applied to various electrical equipments, such as digital camera, touch screen, etc.

Referring to FIG. 2, a control sequence chart of the conventional light sensing circuit is shown. According to both of FIGS. 1 and 2, there may be a preparation stage "P0" before the light sensing circuit 9 operates, wherein the control transistor 92 can connect to the output buffer 95 via the switch 94, the light sensing scan signal "$V_{s1}$" and control scan signal "$V_{s2}$" can be predetermined at a negative voltage level, such as 0 volt, and the bias voltage "$V_b$" can be negative for the photo transistor 91 to work under a negative bias. Thereafter, a sensing stage "P1," a readout stage "P2" and a global reset stage "P3" are sequentially carried out. In the sensing stage "P1," a light sensing process is performed, wherein the light sensing scan signal "$V_{s1}$" can be set at a positive voltage level, such as 5 volts, and the photo transistor 91 is not turned on due to the negative bias. However, if the photo transistor 91 is exposed to light, such as UV light, a detection current "I," namely a positive potential, will charge the capacitor 93 to the positive voltage level. In the readout stage "P2," a readout process is performed, wherein the light sensing scan signal "$V_{s1}$" can be set at the negative voltage level for maintaining the voltage "$V_a$" of the capacitor 93 at the positive voltage level. The control scan signal "$V_{s2}$" can be set at the positive voltage level to turn on the transistor 92, so that the voltage "$V_a$" is outputted as the light sensing signal "$V_o$." In the global reset stage "P3" the control scan signal "$V_{s2}$" can be kept at the positive voltage level, while the source of the control transistor 92 connects to the zero volt by switching the switch 94. Therefore, the voltage "$V_a$" of the capacitor 93 can be discharged through the control transistor 92 and the switch 94. With the above stages, the conventional light sensing circuit 9 may detect the illumination of the surrounding repeatedly.

However, Please refer to FIGS. 3a and 3b, which shows, under different threshold voltages "$V_{th}$," the current curves and the voltage curves of the UV-light-induced detection current "I" and voltage "$V_a$" of the conventional light sensing circuit. The "$V_g - V_{th}$" indicates the voltage difference between the gate voltage "$V_g$" and the threshold voltage "$V_{th}$." The "U1," "U2," and "U3" indicate the current curves of the photo transistor 91 with threshold voltages of 2 V, 4.5 V and 7 V. The "U4," "U5" and "U6" indicate the voltage curves of the photo transistor 91 with threshold voltages of 3 V, 5 V and 7 V. Specifically, since the light sensing circuit lacks of voltage compensation function, the threshold voltage "$V_{th}$" of light sensing circuit may be different from an ideal value due to manufacturing tolerance or aging. Furthermore, according to FIGS. 3a and 3b, the larger the threshold voltage "$V_{th}$" is, the smaller the detection current "I" is, and the difference between two voltages "$V_a$" respectively corresponding to two threshold voltages "$V_{th}$" is also large. Therefore, the reliability of the conventional light sensing circuit 9 may be low due to unstable detection results or errors in determining illumination, which are resulted from differences in light induced current decay or sensitivity.

Thus, a need to improve the above technique exists when applying it to practical use.

SUMMARY OF THE INVENTION

An objective of the present disclosure is to provide a light sensing circuit with high reliability in illumination detection.

Another objective of the present disclosure is to provide control method of said light sensing circuit, so as to improve the reliability in illumination detection.

A light sensing circuit according to the present disclosure includes a photo transistor having a gate, a drain and a source; a first transistor electrically connecting between the gate and source of the photo transistor; a first capacitor electrically connecting between the gate and the drain of the photo transistor; a second transistor electrically connecting with the drain of the photo transistor, the first capacitor, and a data signal; a second capacitor electrically connecting between the source of the photo transistor and a ground contact; a third transistor electrically connecting with the photo transistor, the first transistor, and the second capacitor; and a switch adapted to alternatively connect the third transistor with a buffer or a zero signal; wherein a bias situation of the photo transistor is controlled by a negative voltage signal, the first transistor is turned on or off by a first signal, and the third transistor is turned on or off by a third signal, so that the buffer outputs a light sensing signal generated by the photo transistor.

The photo transistor further has a base, the first transistor has a gate, a drain, and a source, the first capacitor has two terminals, the second transistor has a gate, a drain, and a source, the second capacitor has two terminals, the third transistor has a gate, a drain, and a source, the switch has a common terminal, a first terminal, and a second terminal, the buffer has an input terminal and an output terminal, wherein the gate of the photo transistor electrically connects with the drain of the first transistor and one of the two terminals of the first capacitor, the drain of the photo transistor electrically connects with the other on of the two terminals of the first capacitor and the source of the second transistor, the source of the photo transistor electrically connects with the source of the first transistor, one of the two terminals of the second capacitor, and the drain of the third transistor, the other one of the two terminals of the second capacitor electrically connects with the ground contact, the source of the third transistor electrically connects with the common terminal of the switch, and the first terminal of the switch electrically connects with the input terminal of the buffer.

The second terminal of the switch electrically connects to a common line, the base of the photo transistor electrically connects to a negative voltage line, the gate of the first transistor electrically connects to a first scan line, the gate of the second transistor electrically connects to a second scan line, the drain of the second transistor electrically connects to a data line, and the gate of the third transistor electrically connects to a third scan line.

The common line is adapted for the second terminal of the switch to electrically connect to the zero signal, the negative voltage line is adapted for the base of the photo transistor to electrically connect to the negative voltage signal, the first scan line is adapted for the gate of the first transistor to electrically connect to the first signal, the second scan line is adapted for the gate of the second transistor to electrically connect to the second signal, the third scan line is adapted for the gate of the third transistor to electrically connect to the third signal, and the data line is adapted for the drain of the second transistor to electrically connect to the data signal.

The first signal, the second signal, the third signal, and the data signal are pulse signals.

A control method of the light sensing circuit according to the present disclosure includes the steps of: setting the first signal, the second signal, the third signal, and the data signal at a negative voltage level, and setting the switch for the third transistor to electrically connect to the zero signal; setting the first signal and the second signal at a positive voltage level to turn on the first transistor and the second transistor; setting the first signal and the second signal at the negative voltage level to turn off the first transistor and the second transistor, and setting the third signal at the positive voltage level to turn on the third transistor; setting the second signal at the positive voltage level to turn on the second transistor, and setting the data signal at the positive voltage level for the data signal to couple with the gate of the photo transistor via the first capacitor, so that a current generated by the photo transistor charges the second capacitor; and setting the data signal and the second signal at the negative voltage level, switching the switch for the third transistor to electrically connect to the buffer, and setting the third signal at the positive voltage level, for a potential stored in the second capacitor to be outputted through the switch and the buffer.

The present invention will become clearer in light of the following detailed description of illustrative embodiments of this invention described in connection with the drawings.

BRIEF DESCRIPTION OF THE DRAWINGS

The illustrative embodiments may best be described by reference to the accompanying drawings where.

DETAILED DESCRIPTION OF THE INVENTION

Figure 1:
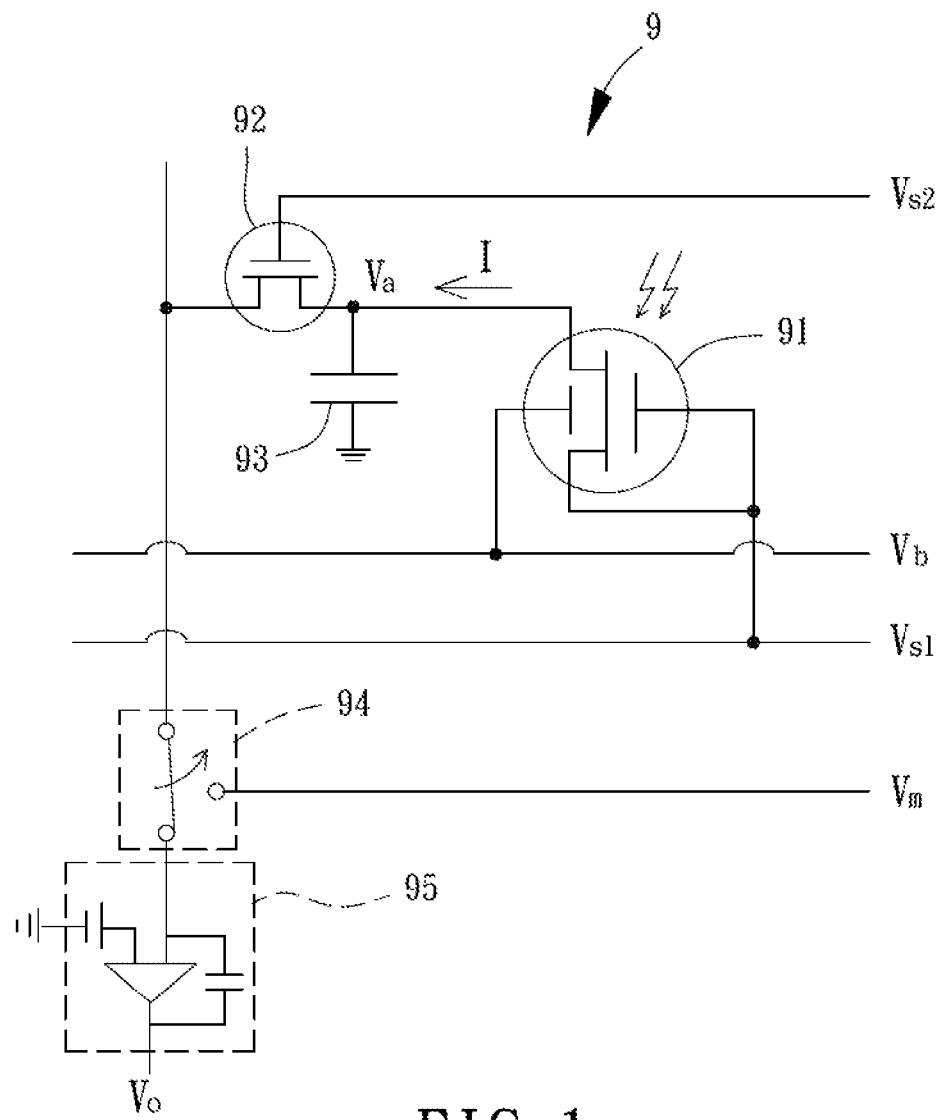
FIG. 1 is a circuit diagram of a conventional light sensing circuit.
Figure 2:
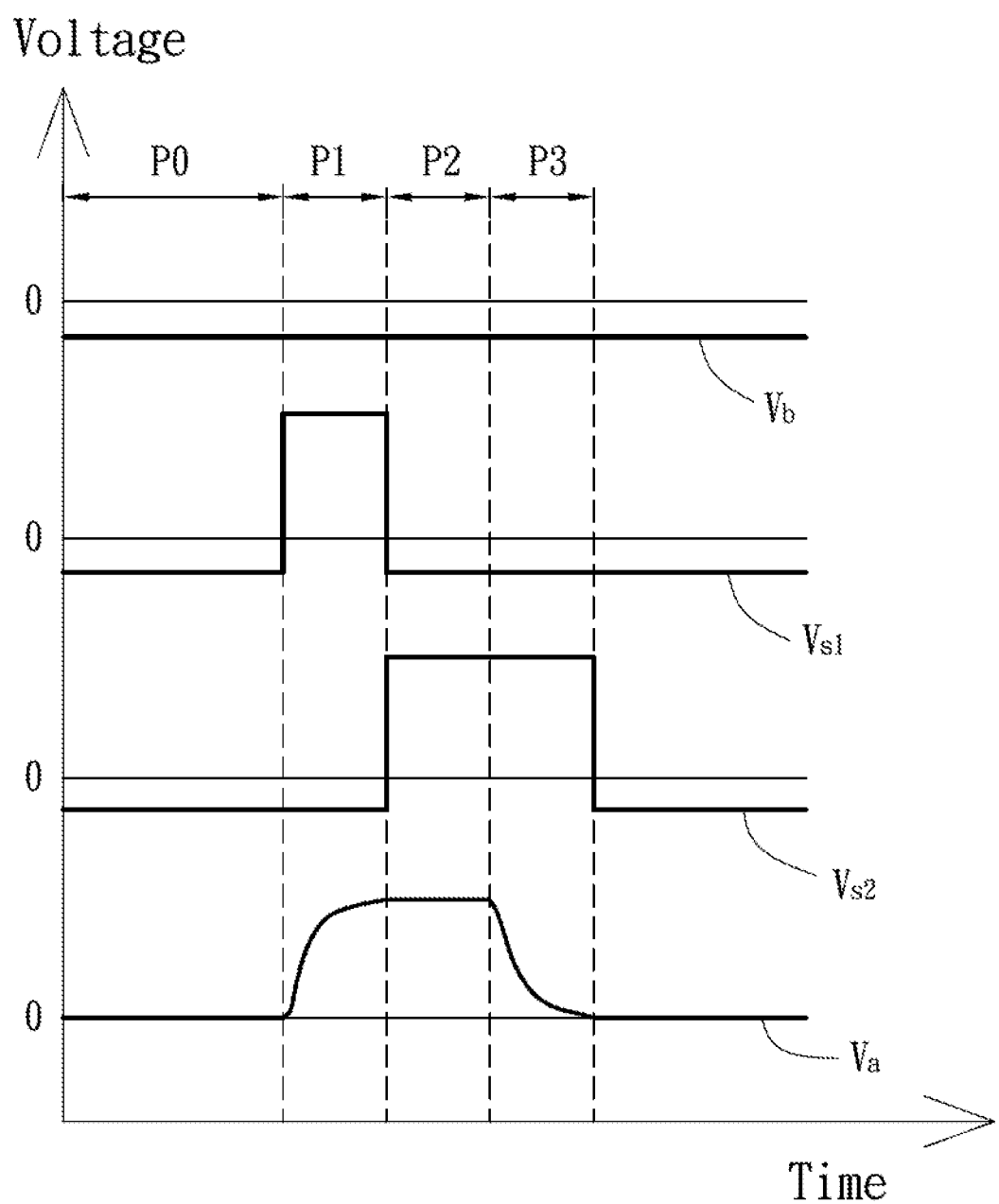
FIG. 2 is a control sequence chart of the conventional light sensing circuit.
Figure 3A:
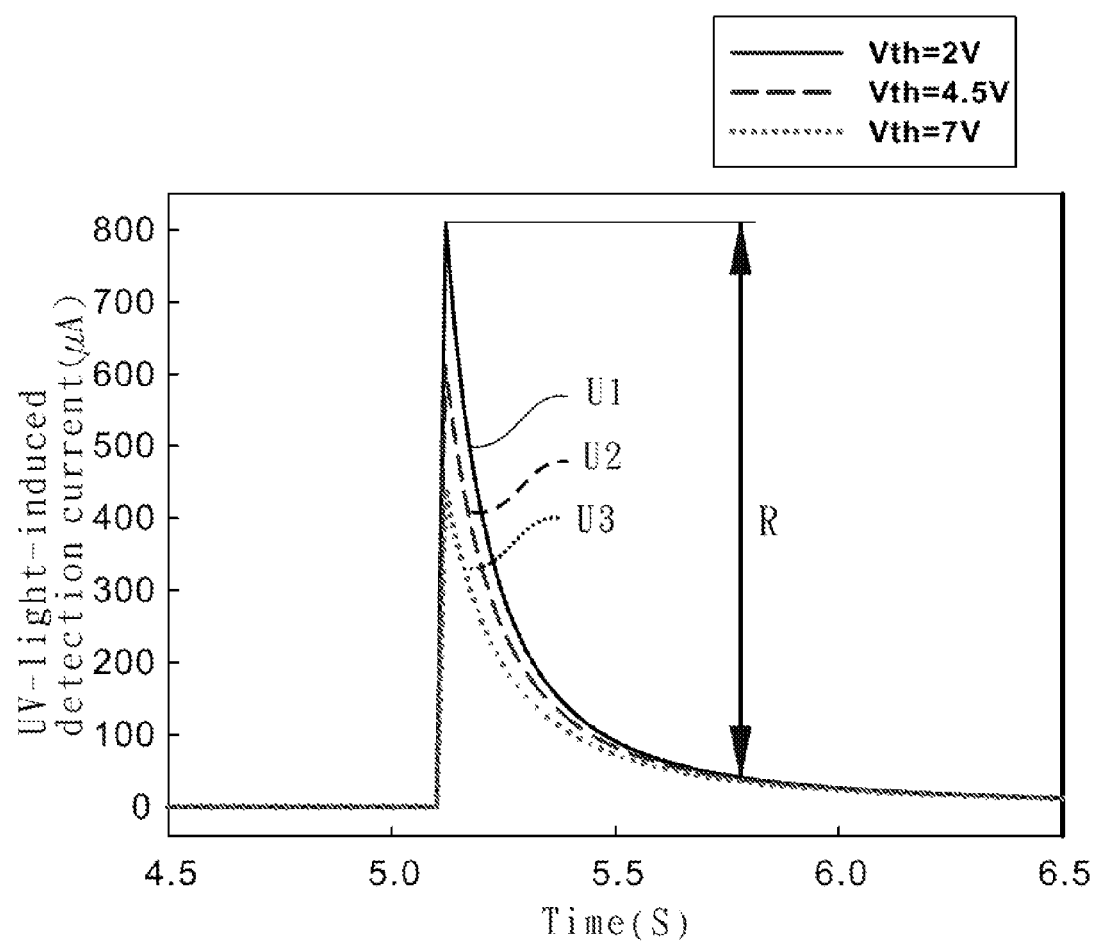
FIG. 3a is the current curve of the UV-light-induced detection current under different threshold voltages of the conventional light sensing circuit.
Figure 3B:
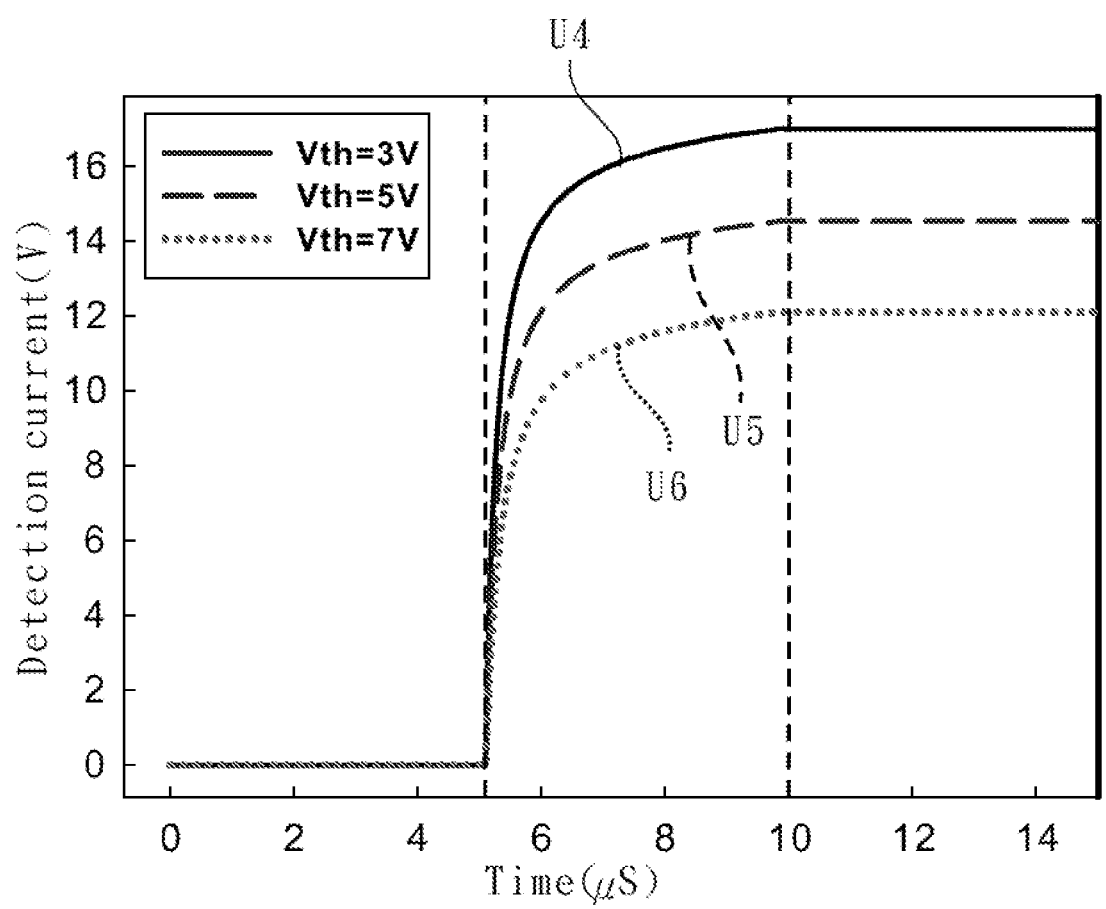
FIG. 3b is the voltage curve of the UV-light-induced detection voltage under different threshold voltages of the conventional light sensing circuit.
Figure 4:
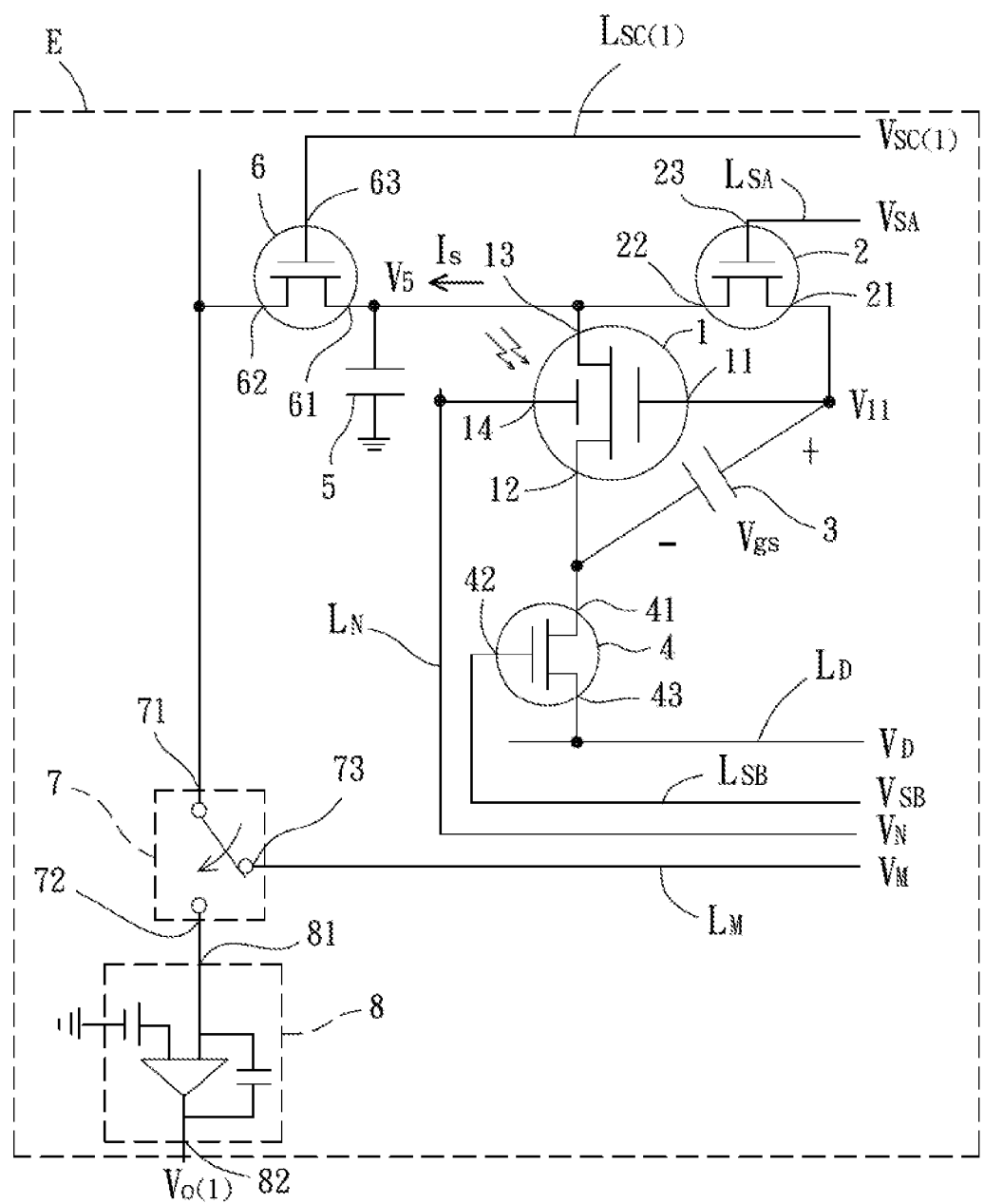
FIG. 4 is a circuit diagram of a light sensing circuit of an embodiment according to the present disclosure.

FIG. 4 is a circuit diagram of an embodiment of a light sensing circuit "E" of the present disclosure. The light sensing circuit "E" includes a photo transistor 1, a first transistor 2, a first capacitor 3, a second transistor 4, a second capacitor 5, a third transistor 6, a switch 7, and a buffer 8. The photo transistor 1 has a gate 11, a drain 12, and a source 13. The first transistor 2 can electrically connect between the gate 11 and source 13 of the photo transistor 1. The first capacitor 3 can electrically connect between the gate 11 and the drain 12 of the photo transistor 1. The second transistor 4 can electrically connect to the drain 12 of the photo transistor 1, the first capacitor 3, and a data signal "$V_D$." The second capacitor 5 electrically connects between the source 13 of the photo transistor 1 and a ground contact. The third transistor 6 electrically connects with the photo transistor 1, the first transistor 2, and the second capacitor 5. The switch 7 is adapted to switch the connection between the third transistor 6 and the buffer 8 or a zero signal "$V_M$." Specifically, the bias situation of the photo transistor 1 is controlled by a negative voltage signal "$V_N$," the first transistor 2 is turned on or off by a first signal "$V_{SA}$," the second transistor 4 is turned on or off by a second signal "$V_{SB}$," and the third transistor 6 is turned on or off by a third signal "$V_{SC(1)}$." Therefore, the buffer 8 can output a light sensing signal generated by the photo transistor 1.

In this embodiment, the photo transistor 1 can be but not limited to a dual gate transistor, such as a Amorphous silicon transistor for sensing visible light or a IGZO transistor for sensing invisible light, UV light for example. The first transistor 2, the second transistor 4, and the third transistor 6 can be thin-film transistors. The first capacitor 3 and the second capacitor 5 can be film capacitors, and the capacitances thereof can be adjusted according to the width-to-length ratio of the photo transistor 1, such as having capacitances but not limited to values between 100 fF and 100 pF. The switch 7 can be a conventional switch, such as a one-to-two switch, and the way to control the switch 7 is well known to one skilled in the related art. The buffer 8 can be a conventional output-signal buffer, such as but not limited to a buffer composed of amplitudes and capacitors.

Referring to FIG. 4 again, a gate 11 of the photo transistor 1 can electrically connect with a drain 21 of the first transistor 2 and a terminal of the first capacitor 3. A drain 12 of the photo transistor 1 can electrically connect with the other terminal of the first capacitor 3 and a source 41 of the second transistor 4. A source 13 of the photo transistor 1 can electrically connect with a source 22 of the first transistor 2, a terminal of the second capacitor 5, and a drain 61 of the third transistor 6. The other terminal of the second capacitor 5 is for grounding. A source 62 of the third transistor 6 electrically connects with a common terminal 71 of the switch 7. A first terminal 72 of the switch 7 electrically connects with an input terminal 81 of the buffer 8. An output terminal 82 of the buffer 8 is adapted to output an output signal "$V_{O(1)}$."

Still referring to FIG. 4, a second terminal 73 of the switch 7 can electrically connect with a common line "$L_M$" for receiving the zero signal "$V_M$" such as a 0 volt DC signal. Furthermore, a base 14 of the photo transistor 1 can electrically connect with a negative voltage line "$L_N$" for receiving the negative voltage signal "$V_N$" such as a −2 volt DC signal, so that the photo transistor 1 works under a negative bias. A gate 23 of the first transistor 2 can electrically connect with a first scan line "$L_{SA}$," so as to receive the first signal "$V_{SA}$." A gate 42 of the second transistor 4 can electrically connect with a second scan line "$L_{SB}$," so as to receive the second signal "$V_{SB}$." A drain 43 of the second transistor 4 can electrically connect with a data line "$L_D$," so as to receive the data signal "$V_D$." A gate 63 of the third transistor 6 can electrically connect with a third scan line "$L_{SC(1)}$" for receiving the third signal "$V_{SC(1)}$." Specifically, each of the first signal "$V_{SA}$," second signal "$V_{SB}$," third signal "$V_{SC}$," and data signal "$V_D$" can be a pulse signal, such as a signal including positive level and negative level, wherein the positive level can be a positive voltage level, and the negative level can be a negative voltage level. Moreover, there can be a plurality of the light sensing circuits to form a light sensing array, so as to be applied in light source or image detection field as illustrated in the following.

Figure 5:
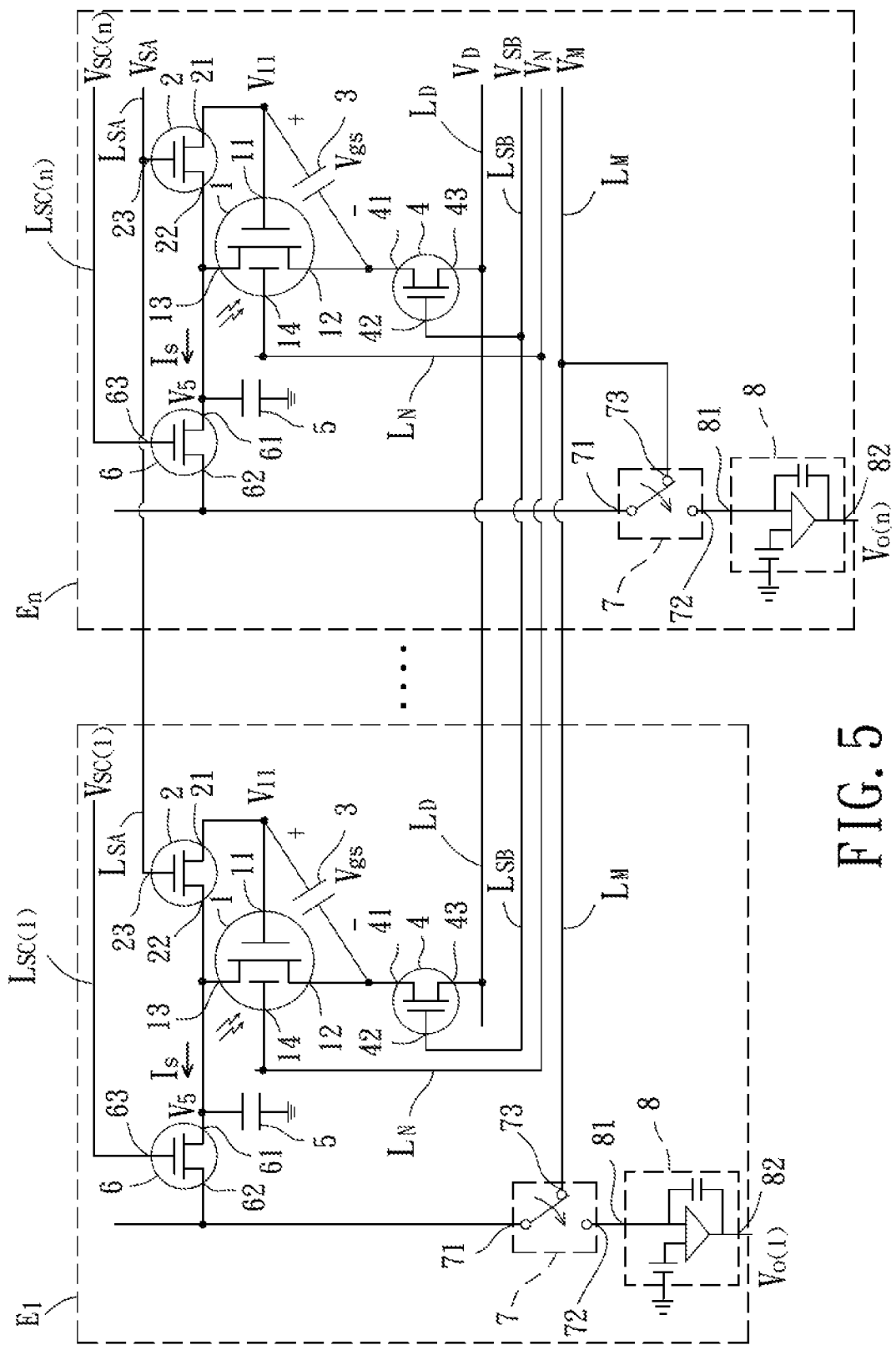
FIG. 5 is a circuit diagram of a light sensing array composed by the light sensing circuit of the embodiment according to the present disclosure.

Referring to FIG. 5, a circuit diagram of a light sensing array composed by the light sensing circuit of the present disclosure is shown. Specifically, the light sensing array is formed by a plurality of light sensing circuits "$E_1$," . . . , "$E_n$." For each of the plurality of light sensing circuits "$E_1$," . . . , "$E_n$," the base 14 of each photo transistor 1 can connect to the negative voltage signal "$V_N$" via the negative voltage line "$L_N$," so that each photo transistor 1 works under the negative bias. The gate 23 of each first transistor 2 electrically can connect to the first signal "$V_{SA}$" via the first scan line "$L_{SA}$." The gate 42 of each second transistor 4 can electrically connect to the second signal "$V_{SB}$" via the second scan line "$L_{SB}$," and the drain 43 of each second transistor 4 can electrically connect to the data signal "$V_D$" via the data line "$L_D$." The gates 63 of the third transistors 6 can electrically and respectively connect to third signals "$V_{SC(1)}$," . . . , "$V_{SC(n)}$," via third scan lines "$L_{SC(1)}$," . . . , "$L_{SC(n)}$." The second terminal 73 of each switch 7 can electrically connect to the zero signal "$V_M$" via the common line "$L_M$." The above way to control the illustrated light sensing circuit and light sensing array is an example and not thus limited.

Figure 6:
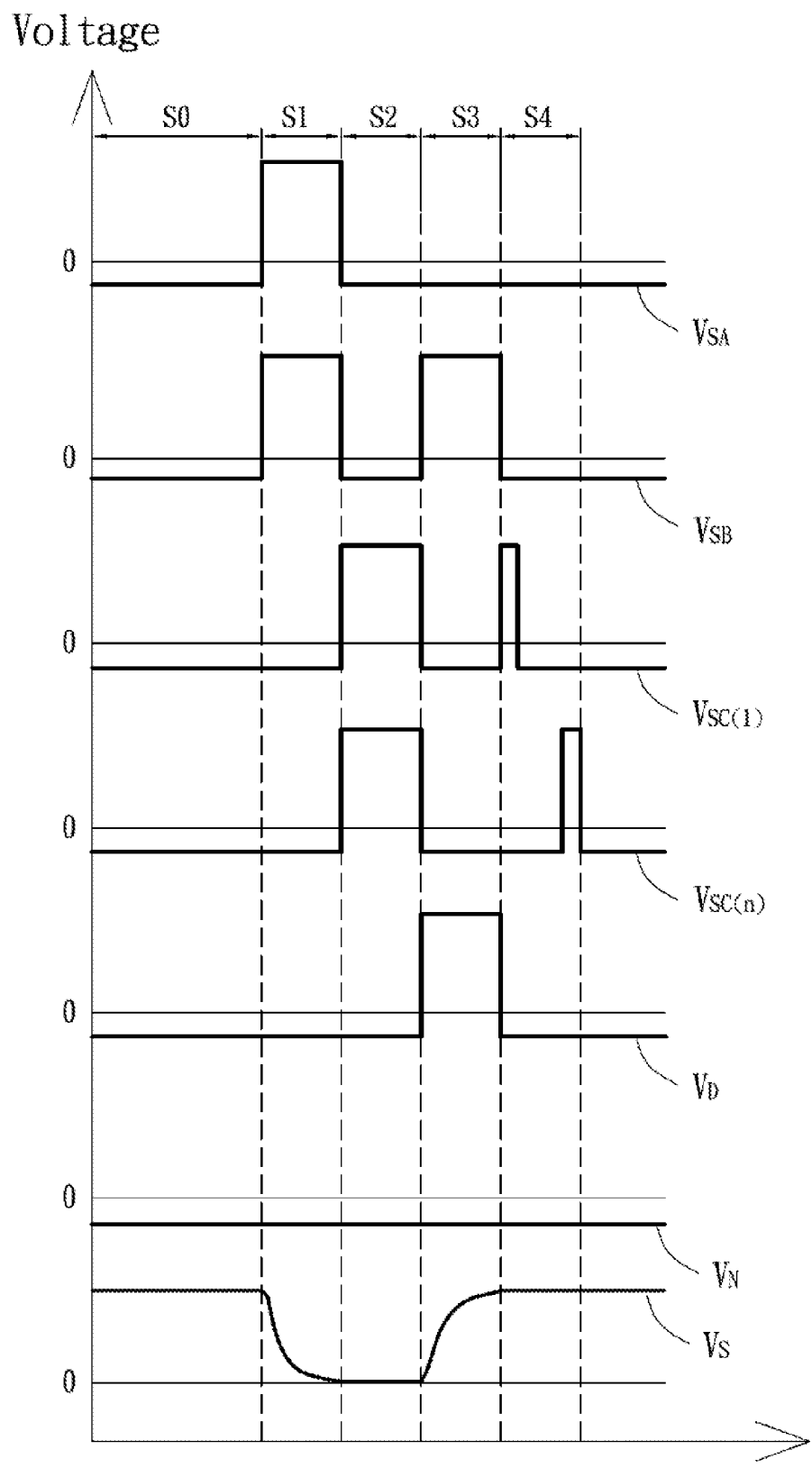
FIG. 6 is a control sequence chart of the light sensing circuit of the embodiment according to the present disclosure.

Referring to FIG. 6, a control sequence chart of a control method to the light sensing circuit of the present disclosure is shown. Before the operation of the light sensing circuit, there may be a preparation stage "P0," wherein the first signal "$V_{SA}$," the second signal "$V_{SB}$," the third signal "$V_{SC}$," and the data signal "$V_D$" can be previously set at a negative level, such as a negative voltage level with the absolute value thereof larger than the value of the threshold voltage "$V_{th}$" of the photo transistors 1. Each of the switch 7 may previously be set as the common terminal 71 connecting with the second terminal 73, so that the zero signal "$V_M$" can be transmitted to the third transistors 6. The switch control to the switches 7 can be performed through a switch scan signal produced by a conventional switch signal generator. The switch control to the switches 7 is understandable to one skilled in the field and thus is not further illustrated. After the preparation stage "P0," a compensation stage "P1," a reset stage "P2," a sensing stage "P3," and a readout stage "P4" are sequentially carried out as shown in FIGS. 4 and 5.

In the compensation stage "P1," the first signal "$V_{SA}$" and the second signal "$V_{SB}$" are set at a positive voltage level such as 5 volt, so that the first transistors 2 and the second transistors 4 are turned on. In this embodiment, since both of the data signal "$V_D$" and the drain 12 of each photo transistors 1 is at the negative voltage level, the voltage difference "$V_{gs}$" between the gate 11 and drain 12 of each photo transistor 1 is larger than the threshold voltage. As a result, after each photo transistor 1 is turned on, the voltage "$V_{11}$" of the gate 11 of each photo transistor 1 is discharged to the data line "$L_D$" through the first capacitor 3 and the second transistor 4. The above operation continues until the voltage "$V_{11}$" of each gate 11 is as low as the threshold voltage "$V_{th}$" of the respect one of the photo transistors 1 so as to turn off said photo transistor 1.

In the reset stage "P2," both of the first signal "VSA" and the second signal "VSB" can be set at a negative voltage level such as −2 volt, so that all of the first transistors 2 and second transistors 4 are turned off; and the third signals "$V_{SC(1)}$," . . . , "$V_{SC(1)}$" can be set at positive voltage levels, so as to turn on the third transistors 6. In this embodiment, since the zero signal "$V_M$" is 0 volt, the second capacitors 5 can discharge the power to the common line "$L_M$" through the third transistors 6, so as to avoid the effect due to the remnant power in the second capacitors 5, such as the effect to the readout data.

In the sensing stage "P3," the second signal "$V_{SB}$" is set at a positive voltage level to turn on the second transistors 4. The data signal "$V_D$" can couple with the gate 11 of the photo transistors 1 via the first capacitors 3, and the detection currents "$I_S$" generated by the photo transistors 1 due to external light, such as UV light, can respectively charge the second capacitors 5. In this embodiment, a capacitance coupling effect occurs since each first capacitor 3 electrically connects the gate 11 and the drain 12 of a respective one of the photo transistors 1. As a result, the voltage "$V_D$" of each gate 11 can be shown as the following equation:

$$V_{11}=V_D+V_{th}+\delta V=V_D+V_{th}+(V_D'-V_D)=V_D'+V_{th} \quad (1).$$

In the above equation (1), "$V_{11}$" represents the potential of the gate 11, "$V_D$" represents the voltage of the data signal, "$V_{th}$" represents the threshold voltage of the photo transistor 1, "$\delta V$" represents the voltage difference obtained by coupling a difference of the negative voltage level "$V_D$" and the positive voltage level "$V_D$" with the gate 11. Accordingly, the potential "$V_{11}$" of the gate 11 is $V_D'+V_{th}$, and the detection current "$I_S$" of the photo transistor 1 can be shown as the following equation:

$$I_S = \frac{k}{2}(V_{gs} - V_{th})^2 = \frac{k}{2}((V_D' + V_{th}) - V_{th})^2 = \frac{k}{2}(V_D')^2. \quad (2)$$

In the above equation (2), "$V_{gs}$" represents the voltage difference between the gate 11 and drain 12 of the photo transistor 1. Through the above equation (2), it can be concluded that the detection current "$I_S$" and the threshold voltage "$V_{th}$" of the photo transistor 1 are irrelevant. Therefore, the light sensing result is not affected by changes of the threshold voltage "$V_{th}$," and thus a change to the light sensing result due to the change of the threshold voltage "$V_{th}$" is thus avoided.

In the readout stage "P4," the data signal "$V_D$" and the second signal "$V_{SB}$" can be set at the negative voltage level; each of the switches 7 can be switched for each third transistor 6 to electrically connect with the buffers 8 respectively; the third signals "$V_{SC(1)}$," ..., "$V_{SC(n)}$" can be set at the positive voltage level in turn, so that the potentials "$V_5$" stored in the second capacitors 5 can output the output signals "$V_{O(1)}$," ..., "$V_{O(n)}$" through the switches 7 and the buffers 8. In this embodiment, the switches 7 can be switched for the common terminal 71 to connect with the first terminal 72, so that the third transistors 6 electrically connect with the buffer 8. Moreover, the time period for the third signals "$V_{SC(1)}$," ..., "$V_{SC(n)}$" to be set at the positive voltage level can be determined according to the actual amount "n" of the scanned output signals "$V_{O(1)}$," ..., "$V_{O(n)}$." For example, if the amount "n" is 10 and thus the light sensing array composed by the light sensing circuit (as shown in FIG. 5) has to scan and output ten output signals "$V_{O(1)}$," ..., "$V_{O(n)}$" of the light sensing circuits in a single period (T), the time period for each third signals "$V_{SC(1)}$," ..., "$V_{SC(n)}$" to be set at the positive voltage level can be, not limited to, $1/10$ of the single period (T).

Figure 7A:
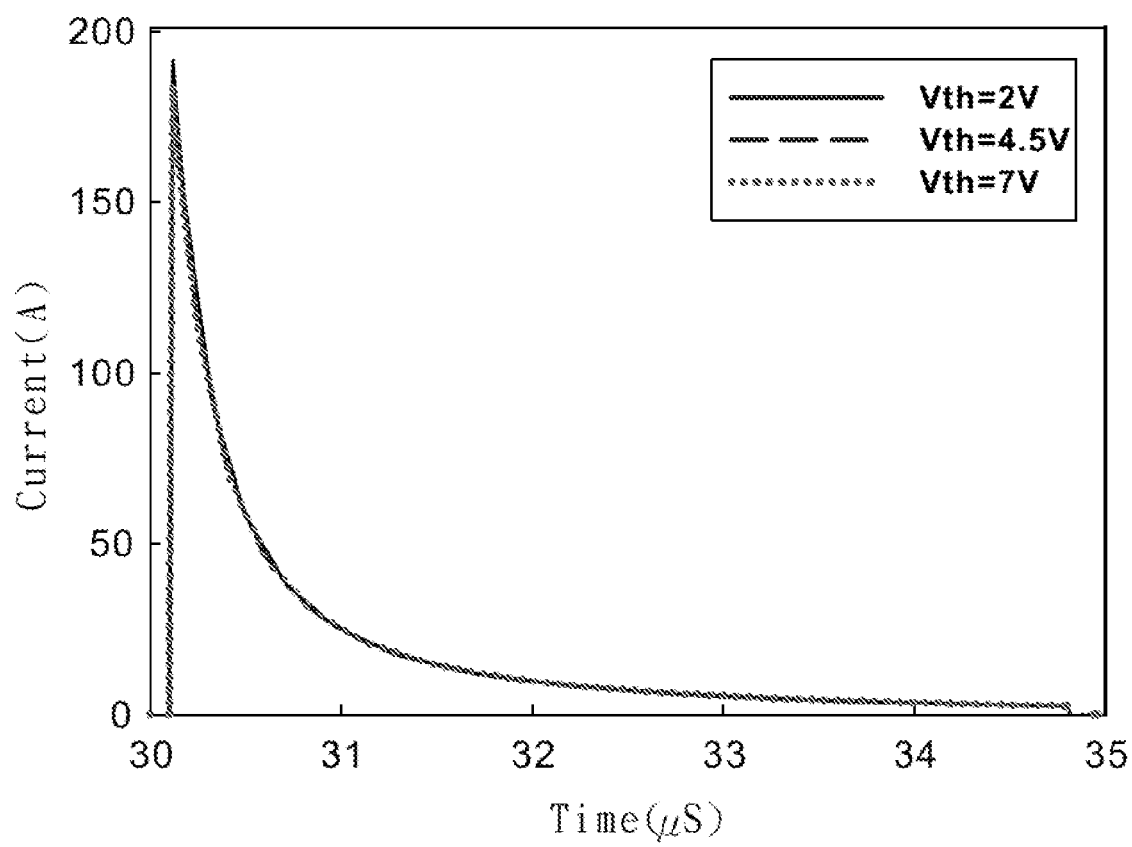
FIG. 7a is the current curve of the UV-light-induced detection current under different threshold voltages of the light sensing circuit of the embodiment according to the present disclosure.
Figure 7B:
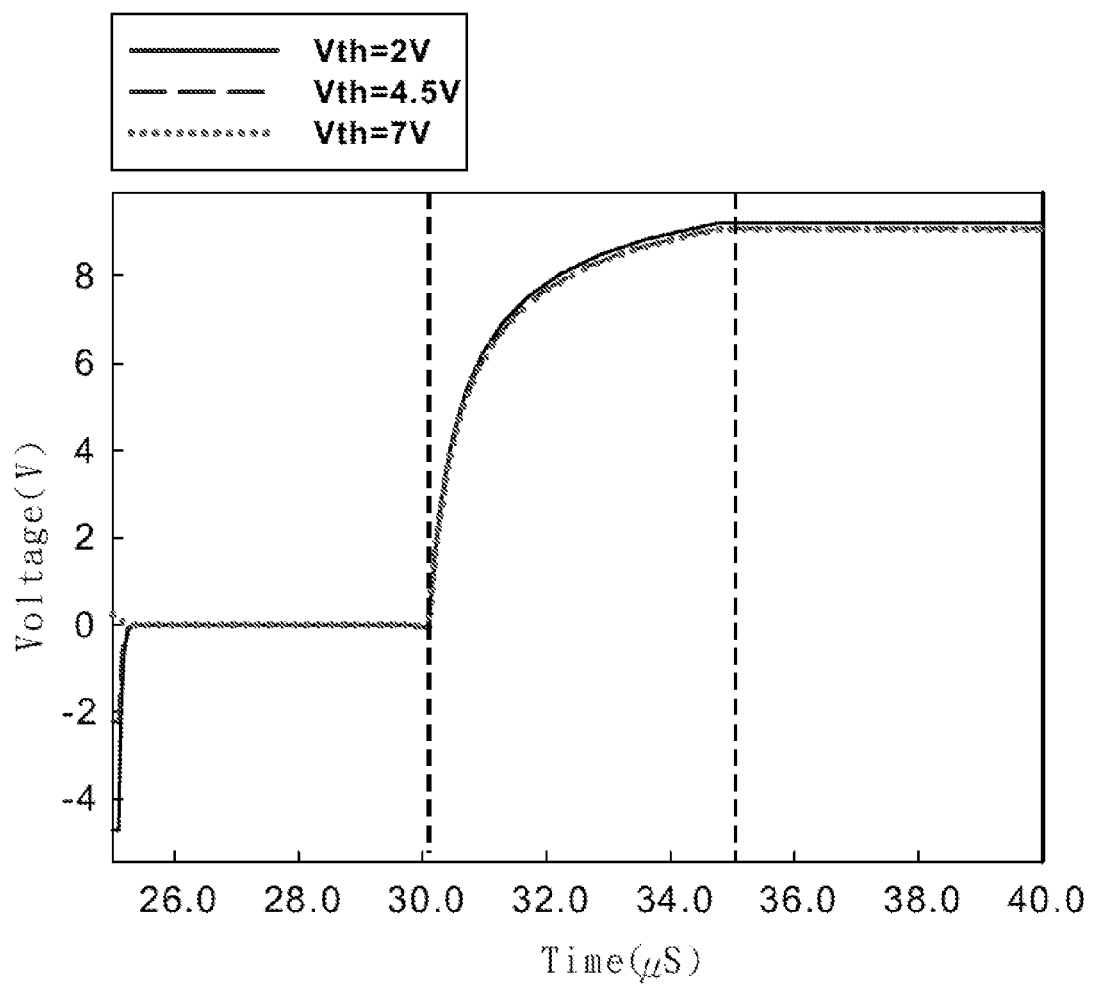
FIG. 7b is the voltage curve of the UV-light-induced detection voltage under different threshold voltages of the light sensing circuit of the embodiment according to the present disclosure.

Referring to FIGS. 7a and 7b, the curves of the detection current and voltage obtained with different threshold voltages of the photo transistor of the present disclosure are shown. The threshold voltages are 2 V, 4.5 V, and 7V, and curves corresponding to them are shown by a solid line, a dotted line with large dots, and another dotted line with small dots respectively. According to FIGS. 7a and 7b, all of the current curves or voltage curves are almost the same totally. Namely, no matter whether or not the threshold voltage "$V_{th}$" of light sensing circuit is different from an ideal value due to manufacturing tolerance or aging, the sensed results under the same illumination do not change or lead to errors in determining illumination. Therefore, the light sensing circuit of the present disclosure can achieve a high reliability in the sensed result.

In sum, the presently disclosed light sensing circuit and the control method thereof are characterized in that: the gate of the photo transistor electrically connects with the drain of the first transistor and a terminal of the first capacitor; the drain of the photo transistor electrically connects with another terminal of the first capacitor and the source of the second transistor; the source of the photo transistor electrically connects with the source of the first transistor, a terminal of the second capacitor, and the drain of the third transistor; the source of the third transistor electrically connects with the common terminal of the switch; and the first terminal of the switch electrically connects with an input terminal of the buffer.

Furthermore, the photo transistor can work under the negative bias; the gate of the first transistor can connect to the first signal; the gate of the second transistor can connect to the second signal; the source of the second transistor can connect to the data signal; the gate of the third transistor can connect to the third signal; and the second terminal of the switch can connect to the zero signal.

With the above arrangement, previously, the first signal, the second signal, the third signal, and the data signal can be set at the negative voltage level, and the switch can be switched to link the zero signal to the third transistor. Next, the first signal and the second signal can be set at the positive voltage level so as to turn on the first transistor and the second transistor. Then, the first signal and the second signal can be set at the negative voltage level while the third signal can be set at the positive voltage level, so that the third transistor is turned on as well as the first transistor and the second transistor are turned off. Further, the data signal and the second signal can be set at the positive voltage level to turn on the second transistor, the data signal can couple to the gate of the photo transistor via the first capacitor, and the detection current resulted from the photo transistor due to the sensed light can charge the second capacitor. Furthermore, the data signal and the second signal can be set at the negative voltage level, the switch can be switched to electrically connect the third transistor with the buffer, the third signal can be set at the positive voltage level, and the potential of the second capacitor can output the output signal through the switch and the buffer.

As a result, with the presently disclosed light sensing circuit and the control method thereof, due to the electrical connection of the photo transistor to the first transistor, the first capacitor, the second transistor, the second capacitor, and the third transistor, the detection current of the photo transistor is irrelevant to the threshold voltage thereof, so that the sensed result is not changed no matter how much the threshold voltage is. Therefore, the disclosed light sensing circuit can have the function of avoiding the affection due to threshold voltage, so as to improve the low reliability problem of conventional light sensing circuit.

Thus since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than by the foregoing description, and all changes which come within the meaning and range of equivalency of the claims are intended to be embraced therein.

What is claimed is:

1. A light sensing circuit, comprising:
   a photo transistor having a gate, a drain and a source;
   a first transistor electrically connecting between the gate and the source of the photo transistor;
   a first capacitor electrically connecting between the gate and the drain of the photo transistor;
   a second transistor electrically connecting with the drain of the photo transistor, the first capacitor, and a data signal;
   a second capacitor electrically connecting between the source of the photo transistor and a ground contact;
   a third transistor electrically connecting with the photo transistor, the first transistor, and the second capacitor; and
   a switch adapted to alternatively connect the third transistor with a buffer or a zero signal;
   wherein a bias situation of the photo transistor is controlled by a negative voltage signal, the first transistor is turned on or off by a first signal, the second transistor is turned on or off by a second signal, and the third transistor is turned on or off by a third signal, so that the buffer outputs a light sensing signal generated by the photo transistor.

2. The light sensing circuit as claimed in claim 1, wherein the photo transistor further has a base, the first transistor has a gate, a drain, and a source, the first capacitor has two terminals, the second transistor has a gate, a drain, and a source, the second capacitor has two terminals, the third transistor has a gate, a drain, and a source, the switch has a common terminal, a first terminal, and a second terminal, the buffer has an input terminal and an output terminal, wherein the gate of the photo transistor electrically connects with the drain of the first transistor and one of the two terminals of the first capacitor, the drain of the photo transistor electrically connects with the other one of the two terminals of the first capacitor and the source of the second transistor, the source of the photo transistor electrically connects with the source of the first transistor, one of the two terminals of the second capacitor, and the drain of the third transistor, the other one of the two terminals of the second capacitor electrically connects with the ground contact, the source of the third transistor electrically connects with the common terminal of the switch, and the first terminal of the switch electrically connects with the input terminal of the buffer.

3. The light sensing circuit as claimed in claim 2, wherein the second terminal of the switch electrically connects to a common line, the base of the photo transistor electrically connects to a negative voltage line, the gate of the first transistor electrically connects to a first scan line, the gate of the second transistor electrically connects to a second scan line, the drain of the second transistor electrically connects to a data line, and the gate of the third transistor electrically connects to a third scan line.

4. The light sensing circuit as claimed in claim 3, wherein the common line is adapted for the second terminal of the switch to electrically connect to the zero signal, the negative voltage line is adapted for the base of the photo transistor to electrically connect to the negative voltage signal, the first scan line is adapted for the gate of the first transistor to electrically connect to the first signal, the second scan line is adapted for the gate of the second transistor to electrically connect to the second signal, the third scan line is adapted for the gate of the third transistor to electrically connect to the third signal, and the data line is adapted for the drain of the second transistor to electrically connect to the data signal.

5. The light sensing circuit as claimed in claim 4, wherein the first signal, the second signal, the third signal, and the data signal are pulse signals.

6. A control method of the light sensing circuit claimed in claim 1, comprising the steps of:
  setting the first signal, the second signal, the third signal, and the data signal at a negative voltage level, and setting the switch for the third transistor to electrically connect to the zero signal;
  setting the first signal and the second signal at a positive voltage level to turn on the first transistor and the second transistor;
  setting the first signal and the second signal at the negative voltage level to turn off the first transistor and the second transistor, and setting the third signal at the positive voltage level to turn on the third transistor;
  setting the second signal at the positive voltage level to turn on the second transistor, and setting the data signal at the positive voltage level for the data signal to couple with the gate of the photo transistor via the first capacitor, so that a detection current generated by the photo transistor charges the second capacitor; and
  setting the data signal and the second signal at the negative voltage level, switching the switch for the third transistor to electrically connect to the buffer, and setting the third signal at the positive voltage level, for a potential stored in the second capacitor to be outputted through the switch and the buffer.

* * * * *